United States Patent
Seki

(10) Patent No.: US 7,126,859 B2
(45) Date of Patent: Oct. 24, 2006

(54) SEMICONDUCTOR INTEGRATED CIRCUIT THAT HANDLES THE INPUT/OUTPUT OF A SIGNAL WITH AN EXTERNAL CIRCUIT

(75) Inventor: Hiroshi Seki, Suwa (JP)

(73) Assignee: Seiko Epson Corporation (JP)

( * ) Notice: Subject to any disclaimer, the term of this patent is extended or adjusted under 35 U.S.C. 154(b) by 266 days.

(21) Appl. No.: 10/853,007

(22) Filed: May 25, 2004

(65) Prior Publication Data

US 2005/0007827 A1 Jan. 13, 2005

(30) Foreign Application Priority Data

May 28, 2003 (JP) ............................. 2003-150050

(51) Int. Cl.
*G11C 16/04* (2006.01)
(52) U.S. Cl. .................. 365/189.05; 365/226
(58) Field of Classification Search ........... 365/189.05, 365/226
See application file for complete search history.

(56) References Cited

U.S. PATENT DOCUMENTS

| | | | | |
|---|---|---|---|---|
| 5,285,412 A | * | 2/1994 | Sugibayashi | ........... 365/189.11 |
| 5,953,261 A | * | 9/1999 | Furutani et al. | ........ 365/189.05 |
| 6,144,221 A | | 11/2000 | Oshima | |
| 6,563,744 B1 | * | 5/2003 | Kuroki | ................... 365/189.05 |
| 6,807,109 B1 | * | 10/2004 | Tomishima | ............ 365/189.05 |
| 6,826,108 B1 | * | 11/2004 | Kang | ......................... 365/226 |

FOREIGN PATENT DOCUMENTS

JP          2000-077996          3/2000

* cited by examiner

*Primary Examiner*—Tuan T. Nguyen
(74) *Attorney, Agent, or Firm*—Harness, Dickey & Pierce, P.L.C.

(57) ABSTRACT

A semiconductor integrated circuit that handles the input/output of a signal with an external circuit. The circuit includes a transistor transmitting a signal between the external circuit and an internal circuit with a drain/source therebetween at a given gate voltage. A first gate voltage supply circuit supplies a voltage at the gate of the transistor when supplied with a first power voltage at a first level of a control signal. A second gate voltage supply circuit supplies a voltage at the gate of the transistor when supplied with a second power voltage that is lower than the first power voltage at a second level of a control signal.

3 Claims, 5 Drawing Sheets

SEMICONDUCTOR INTEGRATED CIRCUIT THAT HANDLES THE INPUT/OUTPUT OF A SIGNAL WITH AN EXTERNAL CIRCUIT

RELATED APPLICATIONS

This applications claims priority to Japanese Patent Application No. 2003-150050 filed May 28, 2003 which is hereby expressly incorporated by reference herein in its entirety.

BACKGROUND

1. Field of the Invention

The present invention relates to a semiconductor integrated circuit including an interface circuit that enables handling of the input/output of a signal to and from an external circuit operating at a different power voltage, and particularly, to a semiconductor integrated circuit that cuts the operation of the interface circuit at a no access mode when no access is effectuated with the external circuit.

2. Description of the Related Art

In recent years, there has been a trend towards lower voltages and higher integration in semiconductor integrated circuits like ICs and LSIs used in electronic equipment to enable low power consumption and high speed operation of various types of electronic equipment. However, considering the characteristics of each type of device, it is extremely difficult to change all of the operation voltages of semiconductor integrated circuits to a lower level simultaneously. Therefore, the need arises for interconnecting these semiconductor integrated circuits through internal interface circuits to account for operating a plurality of semiconductor integrated circuits at different power voltages.

For example, it is conceivable that in a PCI (Peripheral Component Interconnect) card for use in personal computers, the power source voltage of the card itself is 3.3 V, and that the power source voltage of other cards connected to a bus line connecting the PCI card is 5 V. In that case, an interface circuit is required, that allows inputting an output signal from an external circuit operated at 5 V to an IC of a PCI card operated at 3.3 V without causing any problems.

In general, the absolute value of the maximum rated voltage (hereafter referred to as the withstanding voltage) between the drain and the gate of the MOS transistor in semiconductor integrated circuits operated at 3.3 V will be higher than the power source voltage of 3.3 V, but to conform with high speed operation, will be lower than the withstanding voltage of the MOS transistor in the semiconductor integrated circuit operated at 5 V, and thus, is often lower than 5 V. In such a case, it will not be possible to input the output signal of a semiconductor integrated circuit operating at 5 V into a semiconductor integrated circuit operating at 3.3 V.

Here, an interface circuit is proposed that solves the problem of the withstanding voltage when connecting an external circuit operated at a different power source voltage. FIG. 4 is a circuit diagram showing part of the configuration of such a conventional interface circuit. As shown in FIG. 4, this interface circuit includes an external input/output terminal (pad) PD, an input buffer IB, and an n-channel MOS transistor QN10 having a drain/source connected between the pad PD and the input buffer IB.

A power source voltage of 3.3 V is supplied to the input buffer IB, and the gate of the transistor QN10. On the other hand, a signal of 0 V to 5 V is input at the pad PD. The transistor QN10 functions as a transfer gate or a transmission gate that exchanges the output signal of the 5 V circuit adjusting it to the 3.3 V circuit.

FIG. 5 is a view showing the relationship between the pad potential and the input/output potential of the transfer gate. In FIG. 5, the lateral axis shows the pad potential $V_{PD}$, the vertical axis shows the drain potential $V_D$ and the source potential $V_s$ of the transistor QN10 that functions as a transfer gate. In the case where the pad potential VPD changes in the range between 0 V and 5 V, the drain potential $V_D$ of the transistor QN10 changes following the former.

On the other hand, the source potential $V_s$ of the transistor QN10, in the case where the threshold voltage of the transistor QN10 is shown as $V_{TN}$, does not exceed $(3.3-V_{TN})$ V, even if the pad potential $V_{PD}$ exceeds 3.3 V. Accordingly, the transfer gate exchanges the output signal of the 5 V circuit into a potential that is lower than the potential of the 3.3 V power source potential, and it can thus be safely supplied to the input buffer IB.

Here, in the case where the pad potential $V_{PD}$ is 5 V, the voltage $V_{DG}$ between the drain and the gate of the transistor QN10 is 1.7 V, and in the case where the pad potential $V_{PD}$ is 0 V, the voltage $V_{DG}$ between the drain and the gate of the transistor QN10 is -3.3 V. On the other hand, the withstanding voltage of the transistor QN10 being larger than 3.3 V, the transistor QN10 will not be destroyed.

However, to attempt to further lower the electrical power consumption of the semiconductor integrated circuit, it is conceivable to reduce the power source voltage of the internal circuits other than the interface circuit to for example 1.8 V, while keeping the power source voltage of the interface circuit at 3.3 V. In the case of such a semiconductor integrated circuit, in the no-access mode where no access takes place to and from the external circuit, the supply of a 3.3 V power source is interrupted, so as to stop the interface circuit from operating, which is advantageous from the point of view of lowering the power consumption.

However, when using an interface circuit such as the interface circuit shown in FIG. 4, a problem such as the one described below arises. That is to say, as shown in FIG. 6, when the power source supply of 3.3 V is interrupted, the gate potential of the transistor QN10 becomes 0 V, and thus, in the case where the pad potential $V_{PD}$ is 5 V, the voltage $V_{DG}$ between the drain and the gate of the transistor QN10 also becomes 5 V. On the other hand, the withstanding voltage of the transistor QN10, even though larger than 3.3 V is smaller than 5 V, thus leading to the deterioration or destruction of the transistor QN10.

As a related art document, in Japanese Unexamined Patent Application Publication No. 2000-77996 (First Page, FIG. 2), an interface circuit, that is a voltage tolerant circuit, is disclosed for preventing a leak current, this being a substantial problem in whichever voltage transition status. However, nothing is disclosed with respect to preventing the deterioration and destruction of the transistor when the main power source supply to the interface circuit is interrupted.

In view of the above issues, the present invention is intended to prevent the deterioration and destruction of the transistor when the main power source supply to the interface circuit is interrupted in a semiconductor integrated circuit including an interface circuit that allows handling of the input and output of signals with an external circuit that operates at a different power source voltage.

SUMMARY

To solve the above issues, the semiconductor integrated circuit of the present invention for handling the input and output of signals between an external circuit that operates at a different power source voltage, includes:

a transistor transmitting a signal between an external circuit and an internal circuit with a drain/source in between, at a given gate voltage;

a first gate voltage supply circuit supplying a voltage at a gate of the transistor when supplied with a first power voltage at a first level of a control signal; and a second gate voltage supply circuit supplying a voltage at a gate of the transistor when supplied with a second power voltage lower than the first power voltage at a second level of a control signal.

Here, alternatively, the first gate voltage supply circuit includes a second transistor and a third transistor, and the second gate voltage supply circuit includes a fourth and a fifth transistor. The second transistor is formed in a well inside the semiconductor substrate, supplying a voltage at the gate of the transistor when the control signal is at a first level, and the third transistor is formed in the well, supplying a voltage at a well when the control signal is at a first level. The fourth transistor is formed in the well, supplying a voltage at the gate of the transistor when the control signal is at a second level, and the fifth transistor is formed in the well, supplying a voltage at the well when the control signal is at a second level.

Further, the semiconductor integrated circuit of the present invention may also have an inverter that inverts a control signal supplied by a first gate voltage supply circuit and supplies it to a second gate voltage supply circuit.

According to the semiconductor integrated circuit of the present invention of a construction such as the above-mentioned, in order to supply a voltage to the gate of the transistor that transmits a signal between an external circuit and an internal circuit having a drain/source in between, a first gate voltage supply circuit that operates by being supplied with a first power source voltage when a control signal is at a first level, and a second gate voltage supply circuit that operates when a second power source voltage is supplied and the control signal is at a second level are provided, and thus, even when the supply of the first power source voltage is interrupted, the deterioration or destruction of the transistor can be prevented.

DETAILED DESCRIPTION

Figure 1:
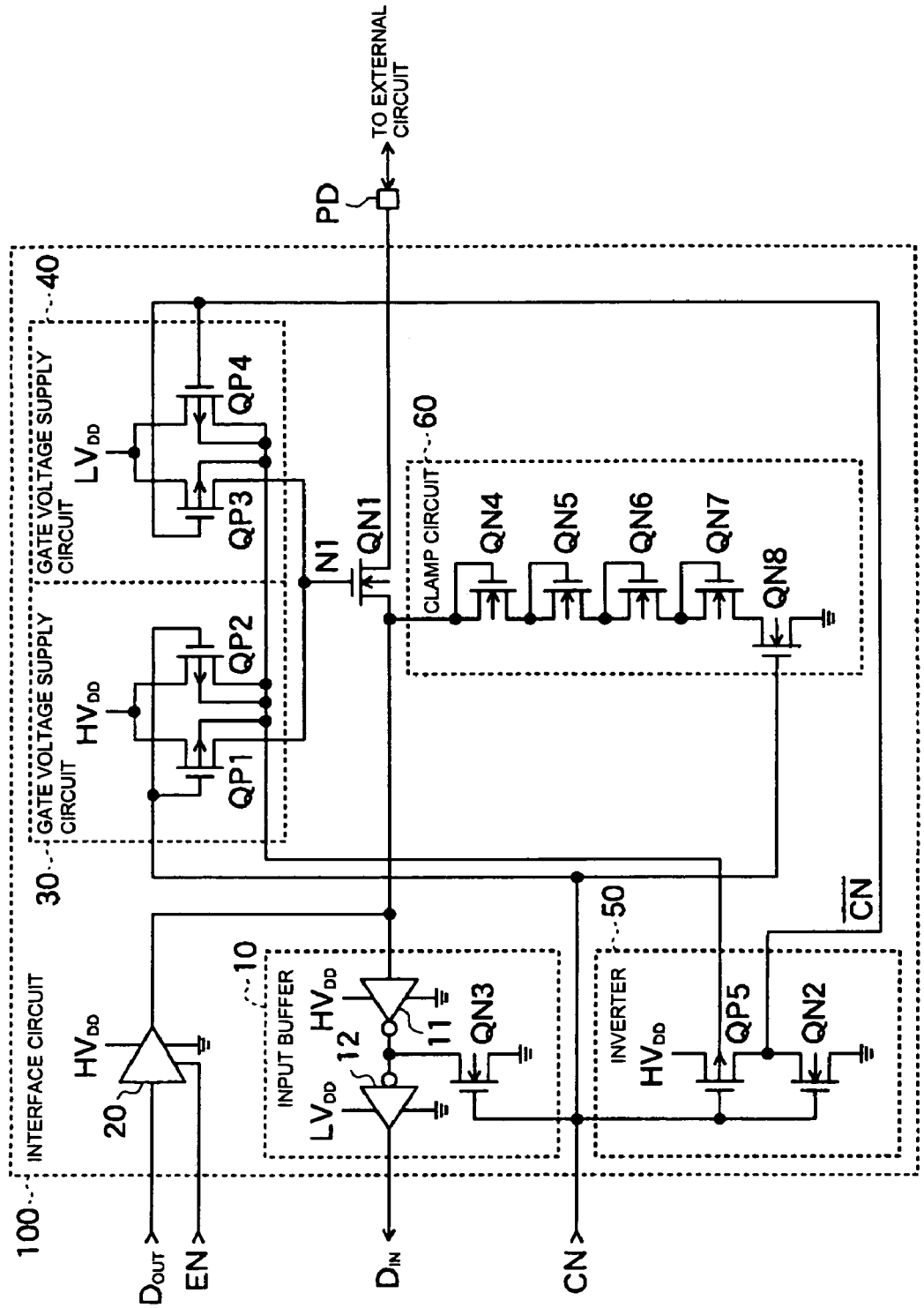
FIG. 1 is a circuit diagram showing a part of a configuration of a semiconductor integrated circuit according to an embodiment of the present invention.

The following is an explanation of embodiments of the present invention with reference to the drawings. It needs to be noted that identical elements of a configuration with the same reference numerals will only be treated once in the explanation.

FIG. 1 is a circuit diagram showing part of the configuration of a semiconductor integrated circuit according to one embodiment of the present invention. This semiconductor integrated circuit includes an external input/output terminal (pad) PD, and an interface circuit 100 that handles the signal transfer (receiving and sending) to an external circuit. That is to say, in general, it includes a plurality of pad and interface circuit systems. In FIG. 1, only one such pad and interface circuit system is shown.

The interface circuit 100 has an input buffer 10, an output driver 20, an n-channel MOS transistor QN1 functioning as a transfer gate that transfers signals between an external circuit and an internal circuit with a drain/source in between the two, a gate voltage supply circuit 30 and 40 respectively, that each provides a voltage to a gate of a transistor QN1, an inverter 50 that inverts a signal CN to provide an output of an inverted control signal $\overline{CN}$, and a clamp circuit 60 that clamps the signal applied from the external circuit.

In the interface circuit 100, a power source voltage $HV_{DD}$ (3.3 V in this embodiment) is provided as the main power source and a power source voltage $LV_{DD}$ (1.8 V in this embodiment) is provided as a secondary power supply. In the internal circuits other than the interface circuit, only the power source voltage $LV_{DD}$ is provided.

In the no-access mode in which no access takes place to and from the external circuit, the control signal is at a high level and the interface circuit is not operating as the supply of the power source voltage $HV_{DD}$ is interrupted. However, at the pad PD, for example, an output signal is applied from the external circuit operating at a power source voltage of 5 V, and thus causing a potential of 0 V to 5 V to be applied.

On the other hand, the absolute value of the maximum rated voltage between the drain and the gate of the transistor QN1 functioning as a transfer gate is higher than the power source voltage $HV_{DD}$ (3.3 V) but lower than 5 V. For example, the thickness of the gate oxide film of the transistor QN1 is 70 A, and the absolute value of the maximum rated voltage between the drain and the gate and between the source and the gate is within the range of 4 V to 4.6 V. Therefore, when the gate voltage of the transistor QN1 becomes 0 V, the voltage between the drain and the gate becomes 5 V, and there is thus a risk of deterioration or destruction the transistor QN1.

In the present embodiment, either one of the gate voltage supply circuit 30 that operates by being supplied with a power source voltage $HV_{DD}$ and the gate voltage supply circuit 40 that operates by being supplied with a power source voltage $LV_{DD}$, supplies the transistor QN1 with the gate voltage.

The gate voltage supply circuit 30 includes a p-channel MOS transistor QP1 and QP2. At the source of the transistor QP1 and QP2, a power source potential HVDD is supplied, and at the gate a control signal CN is applied. The drain of the transistor QP1 is electrically connected to the gate of the transistor QN1, the drain of the transistor QP2 is electrically connected to the back gate electrode of the transistors QP1 through QP5. In the access mode (normal mode) where the external circuit is accessed, the control signal is at a low level, and the transistor QP1 and QP2 are in ON-status, and a voltage of 3.3 V is supplied at the gate of the transistor QN1, and a voltage of 3.3 V is supplied at the back gate electrode of the transistor QP1 through QP5.

The gate voltage supply circuit 40 includes a p-channel MOS transistor QP3 and QP4. At the source of the transistors QP3 and QP4, a power source voltage $LV_{DD}$ is supplied, and at the gate the inverted control signal $\overline{CN}$ is supplied. The drain of the transistor QP3 is electrically connected to the gate of the transistor QN1, the drain of the transistor QP4 is electrically connected to, the back gate electrode of the transistors QP1 through QP5. In the no-access mode where the external circuit is not accessed, the control signal CN is at a high level and the inverted control signal $\overline{CN}$ is at a low level, and thus, the transistors QP3 and QP4 are in an ON-status, and at the gate of the transistor QN1 a voltage of 1.8 V is supplied, and at the back gate electrode of the transistors QP1 Through. QP5 a voltage of 1.8 V is supplied.

The inverter 50 includes a p-channel MOS transistor QP5 and an n-channel MOS transistor QN2 that are connected in series, and produces the inverted control signal $\overline{CN}$ by inverting the control signal CN, and supplies it to the gate voltage supply circuit 40.

The input buffer 10 includes the inverter 11 that operates by being supplied with the power source voltage $HV_{DD}$, the inverter 12 that operates by being supplied with the power source voltage $LV_{DD}$, and the n-channel MOS transistor QN3 that is supplied with the control signal CN at the gate. In the access mode where the external circuit is accessed, the input buffer 10 converts the voltage range of the signal supplied from the pad PD through the transistor QN1 to adapt it to the power source voltage $LV_{DD}$, and outputs it to the other internal circuits as an input data $D_{IN}$. The transistor QN3 is provided to staticize the input potential of the inverter 12 in the no-access mode where the power source voltage. $HV_{DD}$ is not supplied to the inverter 11.

The input/output driver 20 converts the voltage range of the output data $D_{out}$ that is output from other internal circuits when the enable-signal EN is active, adapting it to the power source voltage $HV_{DD}$, and supplies it through the transistor QN1 to the pad PD. On the other hand, when the enable-signal EN is not active, the output terminal of the output driver 20 moves to a high impedance status. That is to say, the output driver 20 has a fail-safe function that ensures that no leak current develops even if a signal is supplied from the external circuit while the supply of the power source voltage $HV_{DD}$ is interrupted.

The clamp circuit 60 includes the n-channel MOS transistors QN4 through QN8 that are connected in series. At the gate of the transistor QN8, a control signal CN is applied, and in the no-access mode where there is no access to and from the external circuit, the control signal CN moves to a high level, and thus, the transistor QN8 moves to an ON-status and the clamp circuit 60 operates. The transistors QN4 through QN7 are each connected, and the input signal is clamped so as to prevent the potential applied at the input terminal of the input buffer 10 from reaching or exceeding about 2.4 V, a factor of four of the threshold voltage $V_{TN}$, assuming the threshold voltage $V_{TN}$ of the n-channel MOS transistor is about 0.6 V. On the other hand, in the access mode where access takes place to and from the external circuit, the control signal CN moves to a low level, the transistor QN8 moves to an OFF-status, and thus, the clamp circuit 60 does not operate.

Next, an explanation about the operation of the gate voltage supply circuit 30 and 40, and the transistor QN1 shown in FIG. 1 is provided.

The drain of the transistor QN1 functioning as a transfer gate is electrically connected to the pad PD, and the source is electrically connected to the input terminal of the input buffer 10, to the output terminal of the output driver 20, and the clamp circuit 60. When a predetermined voltage is supplied to the gate (node N1) of the transistor QN1, the transistor QN1 moves to an ON-status, and a signal is transmitted between the internal circuit and the external circuit through the pad PD. The threshold voltage $V_{TN}$ of the transistor QN1 is ideally 0 V, and preferably, for example, a transistor with a threshold voltage $V_{TN}$ of 0.2 V or lower is used.

In the access mode (normal mode) where access to and from the external circuit takes place, the transistor QP1 of the gate voltage supply circuit 30 moves to an ON-status, and a voltage of about 3.3 V is supplied from the power source potential HVDD through the transistor QP1 to the gate of the transistor QN1.

On the other hand, in the no-access mode where no access takes place to and from the external circuit, the transistor QP3 of the gate voltage supply circuit 40 moves to an ON-status, and a voltage of about 1.8 V is supplied from the power source potential $LV_{DD}$ through the transistor QP3 to the gate of the transistor QN1.

Here, when switching from the access mode (normal mode) to the no-access mode, even if it takes a long time until the power source potential $HV_{DD}$ fades down to 0 V, the gate voltage supply circuits 30 and 40 exchange the operation according to the control signal CN or the inverted control signal $\overline{CN}$, and thus, the potential at the gate of the transistor QN1 does not become instable. However, when using an ordinary transistor for this transistor QP1 and QP3, a problem arises such as the one explained below.

Usually, a power source potential is applied at the back gate electrode of the p-channel MOS transistor. That is, at the back gate electrode of the transistor QP1 a power source potential $HV_{DD}$ (3.3 V) is applied, and at the back gate electrode of the transistor QP3 a power source potential $LV_{DD}$ (1.8 V) is applied.

Figure 2:
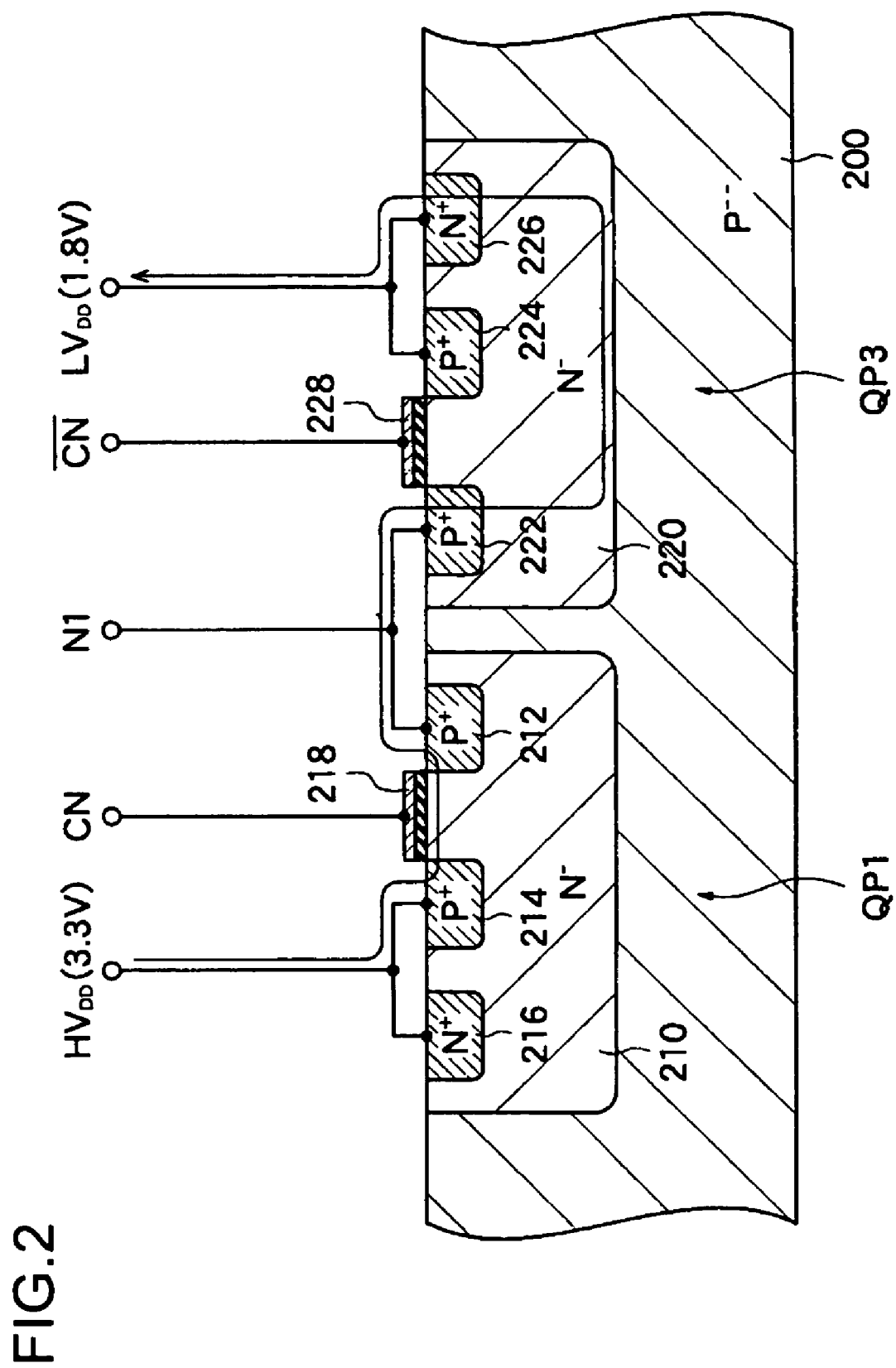
FIG. 2 is a view to explain the problems involved in the case of a common transistor construction.

FIG. 2 is a view to illustrate the problem arising in the case of an ordinary construction of the transistor QP1 and QP3 shown in FIG. 1. As shown in FIG. 2, an n-well 210 and 220 are each formed inside the p-type semiconductor substrate 200. On the n-well 210, the gate electrode 218 of the transistor QP1 is formed with a gate insulation film between the two. Further, on the n-well 220, the gate electrode 228 of the transistor QP3 is formed with a gate insulation film between the two.

Inside the n-well 210, the p-type impurities diffusion regions 212 and 214, to become the drain/source of the transistor QP1, and the n-type impurities diffusion region 216 corresponding to the back gate electrode of the transistor QP3 are formed. Further, inside the n-well 220, the impurities diffusion regions 222 and 224 to become the drain/source of the transistor QP3, and the n-type impurities diffusion region 226 corresponding to the back gate electrode of the transistor QP3 are formed.

The p-type impurities diffusion regions 212 and 222 to become the drain of the transistors QP1 and QP3 are electrically connected to the gate (node N1) of the transistor QN1. The p-type impurities diffusion region 214 to become the source of the transistor QP1 and the n-type impurities diffusion region 216 corresponding to the back gate electrode are supplied with a power source voltage $HV_{DD}$ (3.3 V). On the other hand, the p-type impurities diffusion region 224 to become the source of the transistor QP3 and the n-type impurities diffusion region 226 corresponding to the back gate electrode are supplied with a power source voltage $LV_{DD}$ (1.8 V). Further, at the gate electrode 218 of the transistor QP1, a control signal CN is applied, and at the gate electrode 228 of the transistor QP3, an inverted control signal $\overline{CN}$ is applied.

Turning now to the case where the control signal CN moves to a low level, the transistor QP1 moves to an ON-status, and the transistor QP3 moves to an OFF-status. In this case, even though the transistor QP3 is in an OFF-status, the junction surface (pn-junction) between the p-type impurities diffusion region 222 and the n-well 220 is biased in an easy flow direction, and thus, part of the current flowing from the p-type impurities diffusion region 214 through the n-well 210 to the p-type impurities diffusion region 212 will flow from the p-type impurities diffusion region 222 through the n-well 220 to the p-type impurities diffusion region 226, and between the two different potentials a leak current will occur. To prevent such a leak current, a construction such as the one shown in FIG. 3 is used in the present embodiment.

Figure 3:
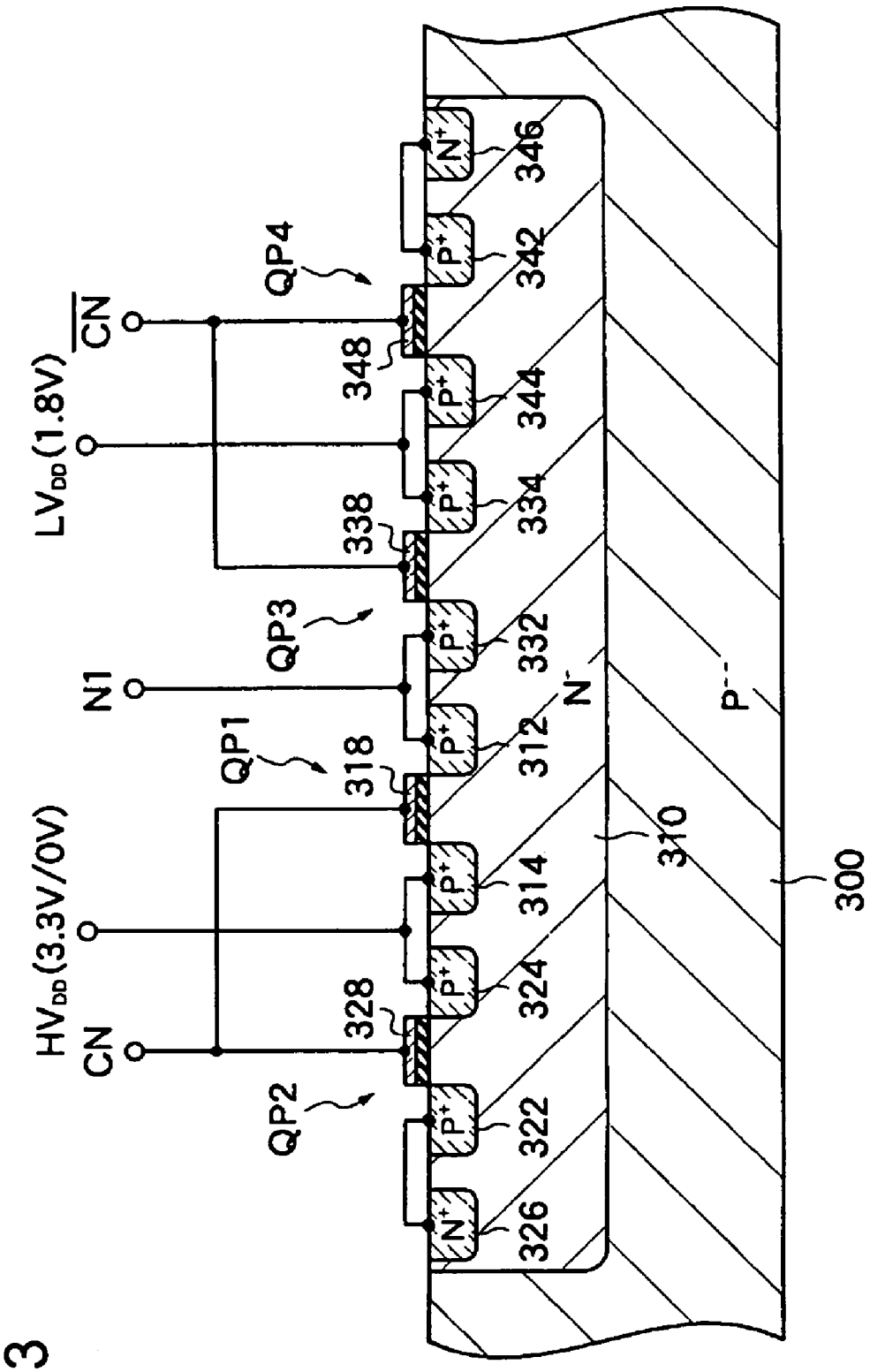
FIG. 3 is a view showing the construction of transistors QP1 to QP4 of the present embodiment.
Figure 4:
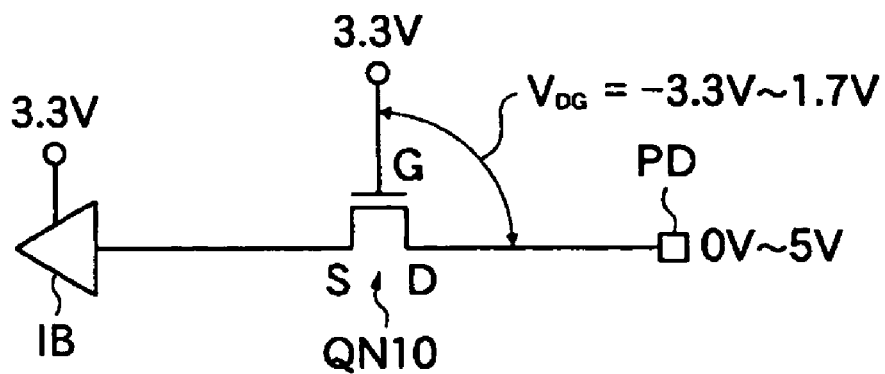
FIG. 4 is a circuit diagram showing part of a conventional interface circuit configuration.
Figure 5:
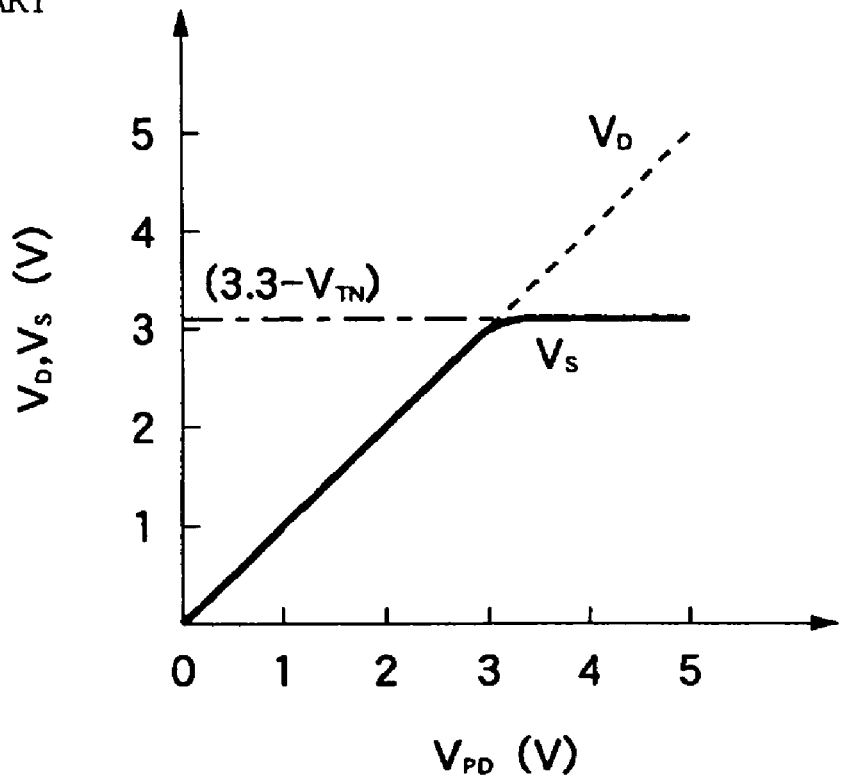
FIG. 5 is a view showing the interrelationship between the pad potential and the transfer gate input/output potential.
Figure 6:
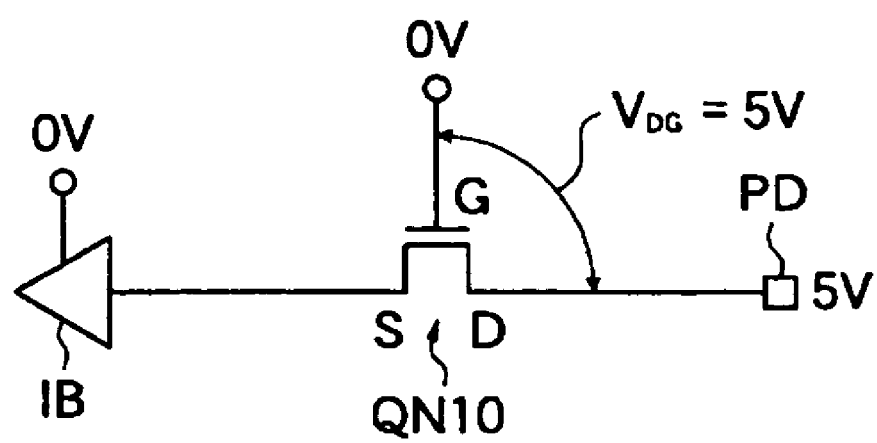
FIG. 6 is a circuit diagram showing the case where the 3.3 V power supply is cut-off in the circuit of FIG. 4.

FIG. 3 is a view showing the construction of the transistors QP1 through QP4 of the present embodiment. As shown in FIG. 3, inside a p-type semiconductor substrate 300, an n-well 310 is formed. On the n-well 310, a gate electrode 318 of the transistor QP1, a gate electrode 328 of the transistor QP2, a gate electrode 338 of the transistor QP3, and a gate electrode 348 of the transistor QP4 are each formed with a gate insulating film therebetween.

Inside the n-well 310, a p-type impurities diffusion region 312 and 314 to become the drain/source of the transistor QP1, a p-type impurities diffusion region 322 and 324 to become the drain/source of the transistor QP2, a p-type impurities diffusion region 332 and 334 to become the drain/source of the transistor QP3, and a p-type impurities diffusion region 342 and 344 to become the drain/source of the transistor QP4 are formed.

The p-type impurities diffusion region 312 to become the drain of the transistor QP1 and QP3 are electrically connected with the gate (node N1) of the transistor QN1. The p-type impurities diffusion region 314 and 324 to become the source of the transistor QP1 and QP2 are supplied with a power source voltage $HV_{DD}$ (3.3 V), and the p-type impurities diffusion region 334 and 344 to become the source of the transistor QP3 and QP4 are supplied with a power source voltage $LV_{DD}$ (1.8 V). Further, the control signal CN is applied at the gate electrode 318 and 328 of the transistor QP1 and QP2, and the inverted control signal $\overline{CN}$ is applied at the gate electrode 338 and 348 of the transistor QP3 and QP4.

With such a configuration, in the access mode (normal mode) where access takes place to and from the external circuit, the control signal CN moves to a low level, and thus, the transistor QP1 and QP2 move to an ON-status, and the transistor QP3 and QP4 move to an OFF-level.

On the other hand, in the no-access mode where no access takes place to and from the external circuit, the control signal CN moves to a high level, and thus, the transistors QP1 and QP2 move to an OFF-status, and the transistors QP3 and QP4 move to an ON-status.

What is claimed is:

1. A semiconductor integrated circuit, comprising:
    a transistor transmitting a signal between an external circuit and an internal circuit through a drain/source when a given gate voltage is supplied;
    a first gate voltage supply circuit supplying a voltage at a gate of the transistor when supplied with a first power voltage at a first level of a control signal; and
    a second gate voltage supply circuit supplying the voltage at the gate of the transistor when supplied with a second power voltage which is lower than the first power voltage at a second level of the control signal;
    wherein the semiconductor integrated circuit handles an input/output of a signal with an external circuit.

2. The semiconductor integrated circuit according to claim 1, further comprising:
    a second transistor and a third transistor included in the first gate voltage supply circuit, wherein:
        the second transistor supplies the voltage at the gate of the transistor at the first level of the control signal, formed in a well provided inside the semiconductor substrate, and
        the third transistor supplies the voltage at the well at the first level of the control signal, formed in the well; and
    a fourth transistor and a fifth transistor included in the second gate voltage supply circuit, wherein:
        the fourth transistor supplies the voltage at the gate of the transistor at the second level of the control signal, formed in the well, and
        the fifth transistor supplies the voltage at the well at the second level of the control signal, formed in the well.

3. The semiconductor integrated circuit according to claim 1, further comprising:
    an inverter supplying the second gate voltage supply circuit with an inverted signal of the control signal supplied to the first gate voltage supply circuit.

* * * * *